(12) United States Patent
Lai et al.

(10) Patent No.: US 7,153,713 B2
(45) Date of Patent: Dec. 26, 2006

(54) METHOD FOR MANUFACTURING HIGH EFFICIENCY LIGHT-EMITTING DIODES

(75) Inventors: Wei-Chih Lai, Tainan County (TW); Jinn-Kong Sheu, Tainan County (TW); Chi-Ming Tsai, Tainan County (TW); Cheng-Ta Kuo, Tainan County (TW)

(73) Assignee: Epitech Technology Corporation, Tainan (TW)

( * ) Notice: Subject to any disclaimer, the term of this patent is extended or adjusted under 35 U.S.C. 154(b) by 178 days.

(21) Appl. No.: 11/030,790

(22) Filed: Jan. 7, 2005

(65) Prior Publication Data

US 2006/0094138 A1 May 4, 2006

(30) Foreign Application Priority Data

Oct. 29, 2004 (TW) .............................. 93133086 A

(51) Int. Cl.
*H01L 21/00* (2006.01)

(52) U.S. Cl. ............................ 438/29; 438/22; 438/24; 438/48; 438/E33.006; 257/79; 257/99

(58) Field of Classification Search .................. 438/29; 257/79
See application file for complete search history.

(56) References Cited

U.S. PATENT DOCUMENTS

2002/0104996 A1* 8/2002 Kuo et al. ..................... 257/79
2006/0102930 A1* 5/2006 Wu et al. ..................... 257/189

* cited by examiner

*Primary Examiner*—Dung A. Le
(74) *Attorney, Agent, or Firm*—Thomas, Kayden, Horstemeyer & Risley

(57) ABSTRACT

A method for manufacturing a high efficiency light-emitting diode (LED) is disclosed. In the method, a substrate is provided, in which an N-type buffer layer, an N-type cladding layer and an active layer are stacked on the substrate in sequence. A first P-type cladding layer is formed on the active layer. Next, a growth-interruption step is performed, and a catalyst is introduced to form a plurality of nuclei sites on a surface of the first P-type cladding layer. A second P-type cladding layer is formed on the first P-type cladding layer according to the nuclei sites, so that the second P-type cladding layer has a surface with a plurality of mesa hillocks. Then, a contact layer is formed on the second P-type cladding layer. Subsequently, a transparent electrode is formed on the contact layer.

28 Claims, 3 Drawing Sheets

METHOD FOR MANUFACTURING HIGH EFFICIENCY LIGHT-EMITTING DIODES

RELATED APPLICATIONS

The present application is based on, and claims priority from, Taiwan Application Serial Number 93133086, filed on Oct. 29, 2004, the disclosure of which is hereby incorporated by reference herein in its entirety.

FIELD OF THE INVENTION

The present invention relates to a method for manufacturing a high efficiency light-emitting diode (LED), and more particularly, to a method for manufacturing a high efficiency light-emitting diode having a rough surface.

BACKGROUND OF THE INVENTION

In general, for a light-emitting diode, the light output depends on the quantum efficiency of the active layer and the light extraction efficiency. The higher the quantum efficiency of the active layer, the higher the light output of the light-emitting diode. Generally, the quantum efficiency of the active layer is increased by improving the quality of epitaxial structure and the structural design of the active layer. In addition, as the light extraction efficiency increases, the light output of the light-emitting diode is enhanced. In order to improve the light extraction efficiency, efforts are made to overcome the significant photon loss resulting from total reflection inside the light-emitting diode after emission from the active layer.

FIG. 1 is a schematic diagram showing the light emission of a conventional light-emitting diode. The light-emitting diode mainly includes a substrate 100, a nucleation layer 102, an N-type semiconductor layer 104, an active layer 106 and a P-type semiconductor layer 108 stacked on the substrate 100 in sequence. FIG. 1 shows that most of the light emitted from the active layer 106 is totally reflected inside the light-emitting diode. After being reflected many times, the light energy is absorbed, thereby greatly reducing the light extraction efficiency of the light-emitting diode.

Typically, roughening a surface of the light-emitting diode is adopted as a means to overcome the total reflection of the light inside the light-emitting diode. There are many methods to roughen a surface of the light-emitting diode, and most of these methods are performed by back-end processes. However, the back-end processes easily change the electrical properties of the light-emitting diode.

Typically, methods for controlling the epitaxial growth conditions to obtain roughened surfaces are categorized as follows. In one method, the substrate is roughened by an etching technique before an epitaxial process is performed, and then the epitaxial growth is performed on the roughened surface. In applying the method, a micro-rough surface can be formed, so as to enhance the light extraction efficiency of the light-emitting diode. However, the surface roughness formed by the method is not significantly rough, so the light extraction efficiency is not enhanced much. Furthermore, the method is relatively complicated.

In another method, the growth temperature of the P-type cladding layer 208 is reduced during the epitaxial growth process, so as to make a surface of the epitaxial film have a plurality of pits 210, such as shown in FIG. 2. In FIG. 2, the light-emitting diode mainly includes a substrate 200, a nucleation layer 202, an N-type cladding layer 204, an active layer 206 and a P-type cladding layer 208 stacked on the substrate 200 in sequence. A roughened surface formed by the method can decrease the degree of total reflection inside the light-emitting diode of the light emitted from the active layer 206, so that the light extraction efficiency of the light-emitting diode can be enhanced. However, such a roughened surface primarily results from the epitaxial film defects of the pits 210, and most of the pits result from the surface termination of threading dislocations 212. That is, in the epitaxial growth process, the threading dislocations 212 extend from mismatched lattice locations in the substrate 200 along the growth directions of the epitaxial film to the film surface. The end points of such threading dislocations 212 form the pits 210, so that the surface is roughened. Such as shown in FIG. 2, the threading dislocations 212, which form the pits 210 in the epitaxial film, pass through the active layer 206. Accordingly, the threading dislocations 212 become leakage paths, so that the light-emitting diode exhibits excessive leakage current during operation and seriously diminishes the electrical quality of the device.

SUMMARY OF THE INVENTION

Therefore, one objective of the present invention is to provide a method for manufacturing a high efficiency light-emitting diode, in which a P-type cladding structure with a roughened surface having a plurality of "mesa hillocks" can be formed, so as to greatly enhance the light extraction efficiency of the light-emitting diode to increase the light output of the light-emitting diode.

Another objective of the present invention is to provide a method for manufacturing a high efficiency light-emitting diode, in which a growth-interruption step forms a multitude of nuclei sites on a surface of a first P-type cladding layer, and then a second P-type cladding layer is grown by using the nuclei sites, so as to create a P-type cladding structure with a rough surface having mesa hillocks. Because the roughening of the surface of the P-type cladding structure does not directly relate to threading dislocations, the excessive leakage current is eliminated by the application of the light-emitting diode formed in the present invention, thereby preventing the electrical properties of the light-emitting diode from being adversely affected.

Still another objective of the present invention is to provide a method for manufacturing a high efficiency light-emitting diode, in which a rough surface having mesa hillocks in a P-type cladding structure can be formed successfully by adding a growth-interruption step during the growth of the P-type cladding structure. Therefore, the method is simple and easily implemented, and the product yield can be effectively enhanced.

According to the aforementioned objectives, the present invention provides a method for manufacturing a high efficiency light-emitting diode comprising: providing a substrate, wherein the substrate comprises an N-type buffer layer, an N-type cladding layer and an active layer stacked thereon in sequence; forming a first P-type cladding layer on the active layer; performing a growth-interruption step, and introducing a catalyst, so as to form a plurality of nuclei sites on a surface of the first P-type cladding layer; forming a second P-type cladding layer on the first P-type cladding layer by using the nuclei sites, so as to make the second P-type cladding layer have a mesa-hillock surface; forming a contact layer on the second P-type cladding layer; and forming a transparent electrode on the contact layer.

According to a preferred embodiment of the present invention, the materials of the N-type buffer layer, the N-type cladding layer, the first P-type cladding and the second P-type cladding are $Al_xIn_yGa_{1-x-y}N$-based materials (where x and y≧0; and 0≦x+y<1), and the contact layer is a doped strained layer superlattice (SLS) structure.

With the catalyst element introduced during the growth-interruption step, a plurality of the nuclei sites can be formed on the surface of the first P-type cladding layer. Due to the nuclei sites, a surface of the second P-type cladding layer can have a plurality of mesa hillocks, so that an objective to roughen a surface of the light-emitting diode can be achieved. Accordingly, the light-emitting diode fabricated by applying the method of the present invention can avoid the excessive leakage current in the prior art and can enhance the electrical quality of the light-emitting diode and greatly increase the light output of the device.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 3–5 are schematic flow diagrams showing the process for manufacturing a light-emitting diode in accordance with a preferred embodiment of the present invention, wherein FIG. 4 shows the scanning electron microscopy (SEM) image of the surface of the light-emitting diode.

DETAILED DESCRIPTION OF THE PREFERRED EMBODIMENT

The present invention discloses a method for manufacturing a high efficiency light-emitting diode, in which a surface of the light-emitting diode can be successfully roughened without affecting the electrical properties of the device, so that the objective to greatly enhance the efficiency of the light-emitting diode can be achieved. In order to make the illustration of the present invention more explicit and complete, the following description is stated with reference to FIGS. 3–5.

Figure 1:
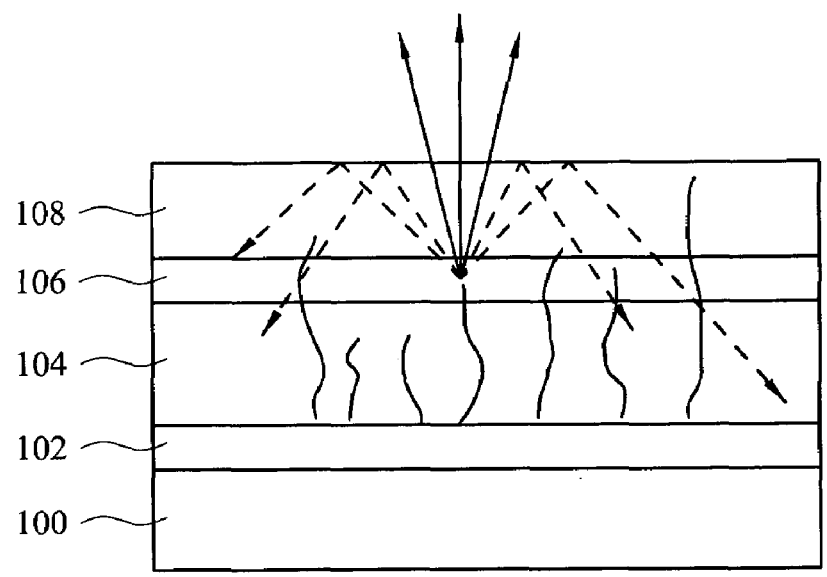
FIG. 1 is a schematic diagram showing the light emission of a conventional light-emitting diode.
Figure 2:
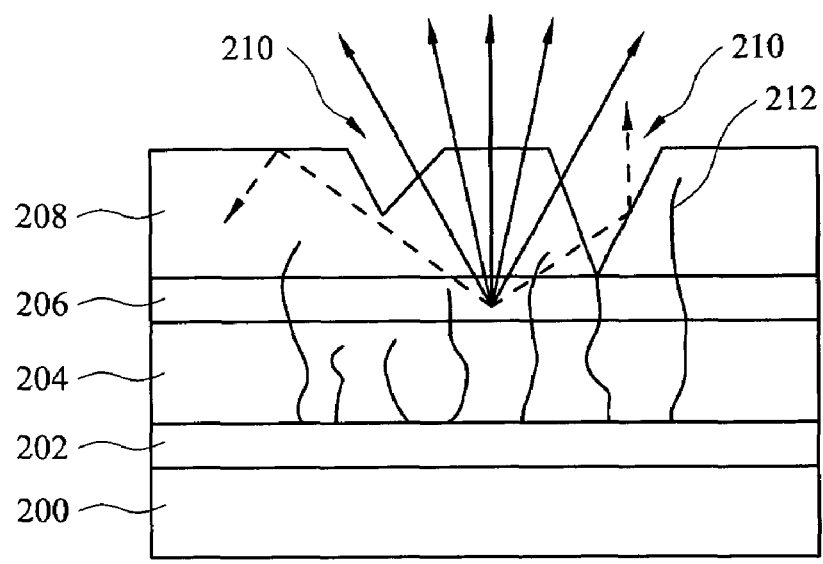
FIG. 2 is a schematic diagram showing the light emission of a conventional light-emitting diode.
Figure 3:
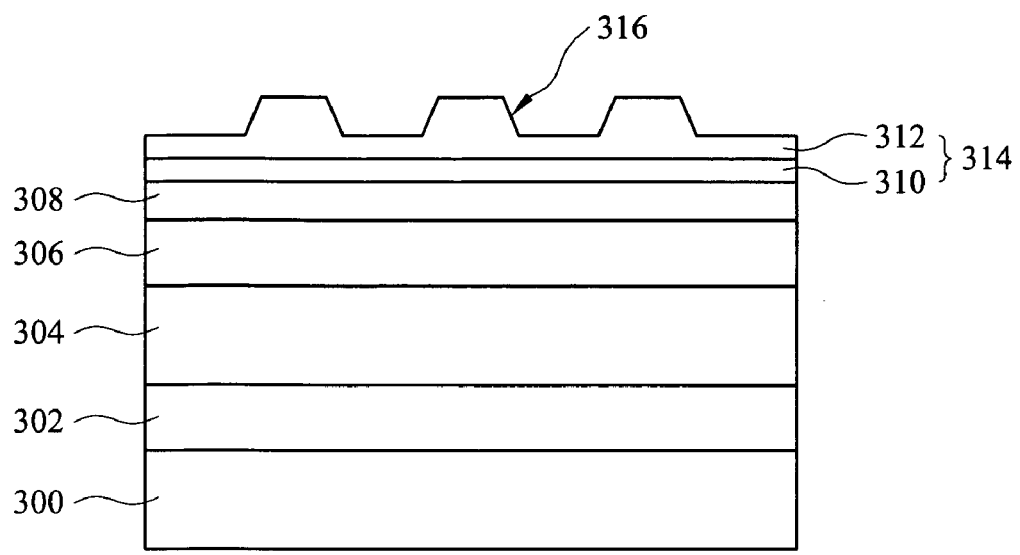
Figure 4:
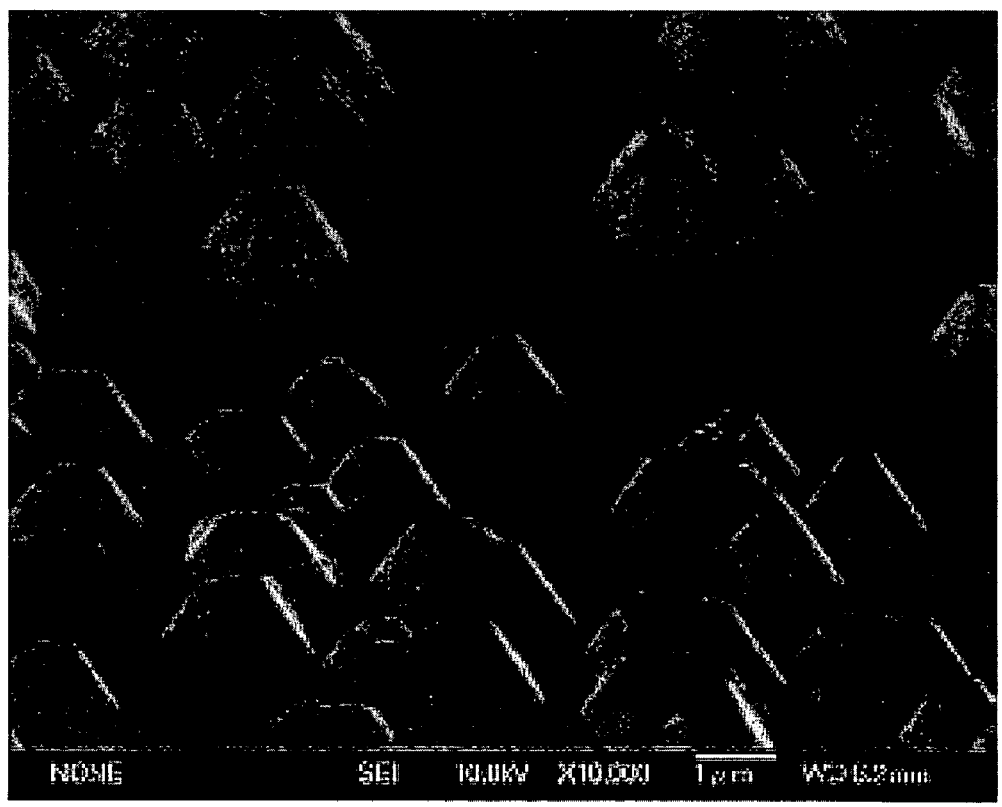
Figure 5:
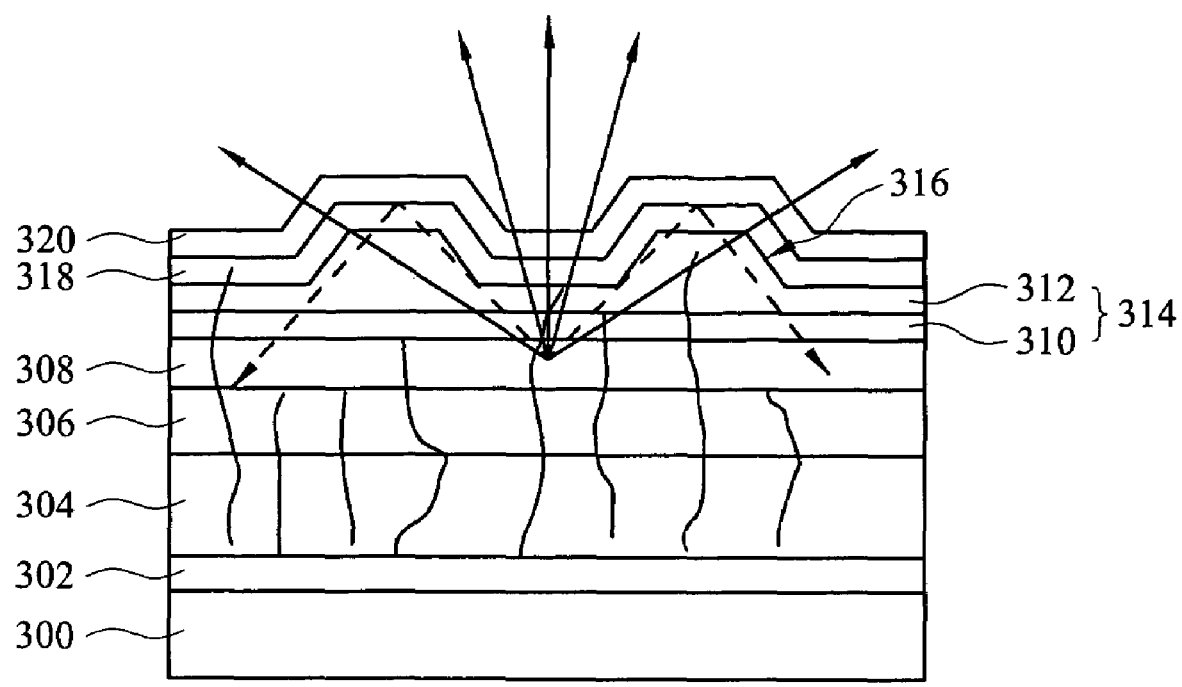

FIGS. 3–5 are schematic flow diagrams showing the process for manufacturing a light-emitting diode in accordance with a preferred embodiment of the present invention. The light-emitting diode can be a III-nitride light-emitting diode, preferably a GaN-based light-emitting diode. When fabricating the light-emitting diode, a substrate 300 is firstly provided, in which a material of the substrate 300 is, for example, sapphire ($Al_2O_3$), silicon (Si), silicon carbide (SiC) or gallium arsenide (GaAs). Next, a nucleation layer 302 is formed on the substrate 300 by, for example, a deposition method. After the formation of the nucleation layer 302 is completed, an N-type buffer layer 304 is epitaxially grown on the nucleation layer 302 by, for example, a metal organic chemical vapor deposition (MOCVD) technique to make the following epitaxial growth steps more successful and easier. A material of the N-type buffer layer 304 is preferably N-type AlGaInN or N-type GaN. An N-type cladding layer 306 is grown on the N-type buffer layer 304 by, for example, a MOCVD technique. A material of the N-type cladding layer 306 is, for example, N-type AlGaInN or N-type GaN. Then, an active layer 308 is epitaxially grown on the N-type cladding layer 306 by, for example, a MOCVD technique, in which the active layer 308 is preferably a multiple quantum well (MQW) structure composed of AlGaInN and GaN.

After the active layer 308 is formed completely, a P-type cladding structure 314 is grown by, for example, a MOCVD method. Firstly, a first stage of a P-type material film is grown by using trimethylgallium (TMGa), trimethylaluminum (TMAl), trimethylindium (TMIn) and ammonia ($NH_3$) as the reactive gas and adding P-type dopants, such as magnesium (Mg), so as to form a first P-type cladding layer 310 on the active layer 308. Next, a growth-interruption step is performed to interrupt the growth of the P-type cladding layer. In a preferred embodiment of the present invention, the growth-interruption step is to stop providing TMGa. Furthermore, in the growth-interruption step, the reactive gas can be $NH_3$, $N_2$ or $H_2$. When proceeding the growth-interruption step, a catalyst is introduced to form nuclei sites (not shown), which are distributed densely on a surface of the first P-type cladding layer 310. The catalyst includes at least one catalyst element. The catalyst element can be any of the typical impurities used for doping semiconductors, such as Mg, Zn, Sn, Pb, Be, Ca, Ba, Si, C, Ge, P, As, Hg, Cd, Te, Sb, Se, B, Bi, S, Fe, Ti, Cr, W, Au, Pt, Al, In or Ga. The introduction of the catalyst element can occur by the reaction with at least one chemical selected from the group consisting of $(C_5H_5)_2Mg$, $(C_2H_5)_2Zn$, $(CH_3)_2Zn$, $(C_2H_5)_4Zn$, $(CH_3)_4Zn$, $(C_5H_5)_4Pb$, Be, Ca, Ba, $SiH_4$, $Si_2H_6$, $CCl_4$, $CBr_4$, $CHCl_3$, $GeH_4$, $PH_3$, $AsH_3$, $(CH_3)_2Hg$, $(CH_3)_2Cd$, $(C_2H_5)_2Te$, $(CH_3)_2Te$, $(C_2H_5)_2Sb$, $(CH_3)_2Sb$, $H_2Se$, $(C_2H_5)_2Se$, $(CH_3)_2Se$, $(C_2H_5)_3B$, $(CH_3)_3Bi$, $(C_2H_5)_2S$, $(C_2H_5)_2Fe$, Ti, Cr, W, Au, Pt, $(CH_3)_3Al$, $(C_2H_5)_3Al$, $(CH_3)_3In$ and $(CH_3)_3Ga$, $(C_2H_5)_3Ga$. Note that when the P-type do used to form the first P-type cladding layer 310 is the same as the catalyst element, the introduction of the P-type dopant does not need to be stopped and instead can be continued to act as the catalyst. When the P-type dopant used to form the first P-type cladding layer 310 is different from the catalyst element, the P-type dopant provision is stopped when the catalyst element is introduced. In the preferred embodiment of the present invention, $NH_3$ is used as a reactive gas and the catalyst is introduced in the growth-interruption step.

In the growth-interruption step, the distribution density and size of the nuclei sites can be adjusted by controlling the time, flow rate of the reactive gas and chamber pressure of the growth-interruption step, so that the roughness of the surface of the light-emitting diode chip can be adjusted and controlled, i.e., the height, size and angle of the inclined plane of a resulting mesa hillock 316 can be controlled.

After the growth-interruption step is performed completely, a second-stage growth step for the P-type cladding layer is performed by using the nuclei sites distributed on the first P-type cladding layer, using, for example, TMGa, TMAl, TMIn and $NH_3$ as the reactive gas, and adding P-type dopants, such as Mg, so as to form a second P-type cladding layer 312 on the first P-type cladding layer 310. That is, the reactive gas, such as TMGa, which is stopped being supplied in the former growth-interruption step, is re-supplied. In the second-stage growth step, the nuclei sites are distributed on the epitaxial surface, i.e. the surface of the first P-type cladding layer 310, so the epitaxy of the second P-type cladding layer 312 can be grown based on the nuclei sites. That is, the purpose of using the nuclei sites formed in the aforementioned step is to accelerate the vertical growth rate in particular locations, so as to achieve an undulated surface profile, i.e. to form a plurality of mesa hillocks 316, such as shown in FIG. 3. The configuration of the mesa hillocks 316 is, for example, polygon, and the sidewalls of the mesa hillocks 316 are not perpendicular to the substrate surface, having a slant. An embodiment of present invention of the LEDs with aforesaid mesa hillocks is shown in FIG. 4. It is clear that a plurality of truncated pyramids can be observed form the scanning electron microscopy (SEM) image. Accordingly, the second P-type cladding layer 312 has a rough surface composed of many mesa hillocks 316. A P-type cladding structure 314 is composed of the first P-type cladding layer 310 and the second P-type cladding layer 312, and the materials of the first P-type cladding layer 310 and the second P-type cladding layer 312 are preferably P-type doped AlGaInN or P-type doped GaN.

It should be noted that forming the rough surface composed of the mesa hillocks 316 is different from that of forming the conventional rough surface composed of pits; the rough surface having the mesa hillocks 316 is not related to threading dislocations. Therefore, in operating, the light-emitting diode does not have excessive leakage current but does have higher light extraction efficiency.

After the P-type cladding structure 314 is formed completely, a contact layer 318 is formed on the second P-type cladding layer 312 by, for example, a MOCVD method. The contact layer 318 is preferably a doped strained layer superlattice structure, more preferably a semiconductor material with properties of periodic and modulated doping, such as a strained layer superlattice material structure doped with Mg, Zn, Be, Cd, Ca, C or Hg. The strained layer superlattice structure has the property of good contact with the transparent electrode 320 formed in the following step, so a high electrical conductivity is obtained. The transparent electrode 320 is formed on the contact layer 318 by, for example, an evaporation technique to be used as an anode of the light-emitting diode, so that the structure shown in FIG. 5 is formed. The transparent electrode 320 can be composed of an N-type doped material or a P-type doped material, and a material of the transparent electrode 320 is, for example, indium tin oxide (ITO), cadmium tin oxide (CTO), IZO, ZnO doped with Al (ZnO:Al), $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, $SrCu_2O_2$ or an extremely thin metal. In the preferred embodiment of the present invention, the light-emitting efficiency of the device can be increased, and the operating voltage of the device can be lowered by using the doped strained layer superlattice structure as the contact layer 318 and the transparent electrode 320.

Such as shown in FIG. 5, with the rough surface of the second P-type cladding layer 312, the degree of total reflection of the light emitted from the active layer 308 can be effectively decreased, so that the loss of photons can be reduced. Therefore, the light-extraction efficiency of the light-emitting diode is greatly enhanced.

According to the aforementioned description, one advantage of the present invention is that a rough surface having mesa hillocks can be formed by applying the method of the present invention, so the light extraction efficiency of the light-emitting diode can be greatly enhanced, and in turn, achieve the objective of increasing the light output of the light-emitting diode.

According to the aforementioned description, yet another advantage of the present invention is that because the roughening of the surface of the epitaxial structure does not directly relate to threading dislocations, the light-emitting diode is formed in the present invention without excessive leakage current, thereby preventing the electrical properties of the light-emitting diode from being adversely affected.

According to the aforementioned description, a further advantage of the present invention is that a roughened surface having mesa hillocks can be formed successfully by merely adding a growth-interruption step during the growth of the P-type cladding structure; and in the growth-interruption step, the method merely stops supplying the reactive gas and introduces the catalyst. Therefore, the process of the method is simple and the implementation is easy, and the objective of enhancing the product yield can be achieved. The method is certainly not limited to the fabrication of the nitride-based semiconductor light-emitting diode; the method can also be applied in the fabrication of the AlGaInP-based light-emitting diode, in which the reactive gas is changed from $NH_3$ to $PH_3$ or $AsH_3$ for growing the AlGaInP-based semiconductor. The selection of the reactive gas depends on the material desired to grow, and the method adopted is the same.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a high efficiency light-emitting diode (LED), comprising:
   providing a substrate, wherein the substrate comprises an N-type buffer layer, an N-type cladding layer and an active layer stacked thereon in sequence;
   forming a first P-type cladding layer on the active layer;
   performing a growth-interruption step and introducing a catalyst, so as to form a plurality of nuclei sites on a surface of the first P-type cladding layer;
   forming a second P-type cladding layer on the first P-type cladding layer by using the nuclei sites, so as to make the second P-type cladding layer have a mesa-hillock surface;
   forming a contact layer on the second P-type cladding layer; and
   forming a transparent electrode on the contact layer; and
   wherein the growth-interruption step further comprises using a reactive gas selected from the group consisting of $NH_3$, $N_2$ and $H_2$.

2. The method for manufacturing a high efficiency light-emitting diode according to claim 1, further comprising forming a nucleation layer on the substrate before the step of forming the N-type buffer layer, wherein the nucleation layer is located between the substrate and the N-type buffer layer.

3. The method for manufacturing a high efficiency light-emitting diode according to claim 1, wherein a material of the substrate is selected from the group consisting of sapphire ($Al_2O_3$), Si, SiC and GaAs.

4. The method for manufacturing a high efficiency light-emitting diode according to claim 1, wherein a material of the N-type buffer layer is selected from the group consisting of N-type AlInGaN and N-type GaN.

5. The method for manufacturing a high efficiency light-emitting diode according to claim 1, wherein a material of the N-type cladding layer is selected from the group consisting of N-type AlGaInN and N-type GaN.

6. The method for manufacturing a high efficiency light-emitting diode according to claim 1, wherein the active layer is a multiple quantum well (MQW) structure composed of AlGaInN and GaN.

7. The method for manufacturing a high efficiency light-emitting diode according to claim 1, wherein materials of the first P-type cladding layer and the second P-type cladding layer are selected from the group consisting of P-type AlInGaN and P-type GaN.

8. The method for manufacturing a high efficiency light-emitting diode according to claim 1, wherein the step of forming the first P-type cladding layer and the step of forming the second P-type cladding layer comprise using trimethylgallium (TMGa), TMAl, TMIn and $NH_3$ as the reactive gas.

9. The method for manufacturing a high efficiency light-emitting diode according to claim 1, wherein the catalyst includes at least one catalyst element selected from the group consisting of Mg, Zn, Sn, Pb, Be, Ca, Ba, Si, C, Ge, P, As, Te, Se, B, Bi, S, Ti, Cr, W, Au, Pt, Al, In and Ga.

10. The method for manufacturing a high efficiency light-emitting diode according to claim 1, wherein the mesa-hillock surface is a polygon mesa-hillock surface.

11. The method for manufacturing a high efficiency light-emitting diode according to claim 1, wherein the mesa-hillock surface has a plurality of mesa hillocks, and sidewalls of the mesa hillocks are not perpendicular to a surface of the substrate, thus forming truncated pyramids.

12. The method for manufacturing a high efficiency light-emitting diode according to claim 1, wherein the contact layer is a doped strained layer superlattice (SLS) structure.

13. The method for manufacturing a high efficiency light-emitting diode according to claim 1, wherein the transparent electrode is composed of an N-type material or a P-type material.

14. The method for manufacturing a high efficiency light-emitting diode according to claim 1, wherein a material of the transparent electrode is selected from the group consisting of ITO, CTO, IZO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, $SrCu_2O_2$ and metal.

15. A method for manufacturing a high efficiency light-emitting diode, comprising:
    providing a substrate;
    forming an N-type buffer layer on the substrate;
    forming an N-type cladding layer on the N-type buffer layer;
    forming an active layer on the N-type cladding layer;
    forming a P-type cladding structure on the active layer, wherein the step of forming the P-type cladding structure comprises:
        performing a first growth step to form a first cladding layer on the active layer;
        performing a growth-interruption step and introducing a catalyst, so as to form a plurality of nuclei sites on a surface of the first P-type cladding layer; and
        performing a second growth step to form a second P-type cladding layer on the first P-type cladding layer by using the nuclei sites;
    forming a contact layer on the second P-type cladding layer; and
    forming a transparent electrode on the contact layer; and
    wherein the catalyst includes at least one catalyst element selected from the group consisting of Mg, Zn, Sn, Pb, Be, Ca, Ba, Si, C, Ge, P, As, Te, Se, B, Bi, S, Ti, Cr, W, Au, Pt, Al, In and Ga.

16. The method for manufacturing a high efficiency light-emitting diode according to claim 15, further comprising forming a nucleation layer on the substrate before the step of forming the N-type buffer layer.

17. The method for manufacturing a high efficiency light-emitting diode according to claim 15, wherein a material of the substrate is selected from the group consisting of sapphire, Si, SiC and GaAs.

18. The method for manufacturing a high efficiency light-emitting diode according to claim 15, wherein a material of the N-type buffer layer is selected from the group consisting of N-type AlInGaN and N-type GaN.

19. The method for manufacturing a high efficiency light-emitting diode according to claim 15, wherein a material of the N-type cladding layer is selected from the group consisting of N-type AlGaInN and N-type GaN.

20. The method for manufacturing a high efficiency light-emitting diode according to claim 15, wherein the active layer is a multiple quantum well (MQW) structure composed of AlGaInN and GaN.

21. The method for manufacturing a high efficiency light-emitting diode according to claim 15, wherein materials of the first P-type cladding layer and the second P-type cladding layer are selected from the group consisting of P-type AlInGaN and P-type GaN.

22. The method for manufacturing a high efficiency light-emitting diode according to claim 15, wherein the first growth step and the second growth step comprise using TMGa, TMAl, TMIn and $NH_3$ as the reactive gas.

23. The method for manufacturing a high efficiency light-emitting diode according to claim 15, wherein the growth-interruption step further comprises using a reactive gas selected from the group consisting of $NH_3$, $N_2$ and $H_2$.

24. The method for manufacturing a high efficiency light-emitting diode according to claim 15, wherein the second P-type cladding layer has a polygon mesa-hillock surface.

25. The method for manufacturing a high efficiency light-emitting diode according to claim 15, wherein a surface of the second P-type cladding layer has a plurality of mesa hillocks, and sidewalls of the mesa hillocks are not perpendicular to a surface of the substrate, thus forming truncated pyramids.

26. The method for manufacturing a high efficiency light-emitting diode according to claim 15, wherein the contact layer is a doped strained layer superlattice structure.

27. The method for manufacturing a high efficiency light-emitting diode according to claim 15, wherein the transparent electrode is composed of an N-type material or a P-type material.

28. The method for manufacturing a high efficiency light-emitting diode according to claim 15, wherein a material of the transparent electrode is selected from the group consisting of ITO, CTO, IZO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, $SrCu_2O_2$ and metal.

* * * * *